United States Patent
Arora et al.

(10) Patent No.: US 12,393,246 B1
(45) Date of Patent: Aug. 19, 2025

(54) POWER CONSUMPTION ESTIMATION OF MEMORY UNDER TEST

(71) Applicant: Cadence Design Systems, Inc., San Jose, CA (US)

(72) Inventors: Puneet Arora, Austin, TX (US); Mohit Madaan, Gurugram (IN); Norman Card, Vestal, NY (US); Carl Wisnesky, II, Apalachin, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 86 days.

(21) Appl. No.: 18/405,820

(22) Filed: Jan. 5, 2024

(51) Int. Cl.
*G06F 1/28* (2006.01)
*G11C 29/36* (2006.01)

(52) U.S. Cl.
CPC ............... *G06F 1/28* (2013.01); *G11C 29/36* (2013.01)

(58) Field of Classification Search
CPC .................. G06F 1/28; G11C 29/36
See application file for complete search history.

(56) References Cited

U.S. PATENT DOCUMENTS

| | | | | |
|---|---|---|---|---|
| 2014/0089874 A1* | 3/2014 | Card | ............... | G06F 30/327 |
| | | | | 716/112 |
| 2014/0089875 A1* | 3/2014 | Arora | ............... | G06F 30/327 |
| | | | | 716/112 |
| 2020/0311217 A1* | 10/2020 | Jose | ............... | G06F 30/34 |
| 2022/0318475 A1* | 10/2022 | Morgan | ............... | G06F 30/392 |

* cited by examiner

*Primary Examiner* — Albert Decady
*Assistant Examiner* — Osman M Alshack
(74) *Attorney, Agent, or Firm* — Schwegman Lundberg & Woessner, P.A.

(57) ABSTRACT

Various embodiments provide for estimating power consumption by one or more memory components of a circuit design during memory testing, which can be used as part of an electronic design automation (EDA) software.

20 Claims, 6 Drawing Sheets

POWER CONSUMPTION ESTIMATION OF MEMORY UNDER TEST

TECHNICAL FIELD

Embodiments described herein relate to circuit design and, more particularly, to systems, methods, devices, and instructions for estimating power consumption by one or more memory components of a circuit design during memory testing, which can be used as part of an electronic design automation (EDA) software.

BACKGROUND

A memory built-in self-test (MBIST) can comprise one or more components inserted into a circuit design to enable testing of one or more memory components of a physical circuit that result from the circuit design. Specifically, an MBIST of a physical circuit can enable systematic writing and reading of data patterns (e.g., test data patterns) to and from the one or more memory components of the physical circuit. An MBIST can also facilitate failure analysis of memory components of a physical circuit, can facilitate software or hardware repair of memory components on the physical circuit, and can reduce design complexity of the physical circuit, all of which can improve the yield of the physical circuit. Usually, memory components of a physical circuit are tested by an MBIST using one or more test algorithms (e.g., read or write test algorithms), and usually tested in parallel to reduce memory test time.

BRIEF DESCRIPTION OF THE DRAWINGS

The appended drawings merely illustrate various embodiments of the present disclosure and should not be considered as limiting its scope.

DETAILED DESCRIPTION

While power consumption (e.g., power dissipation) by memory components can vary between different memory types and different memory testing algorithms, parallel testing of memory components of a physical circuit (e.g., using the MBIST) typically reduces memory test time at the expense of increased power consumption within the physical circuit. During testing of memory components of a physical circuit, power consumption by the memory components can be much higher (e.g., due to memory components being tested in parallel) than during functional operation of memory components. It is common for a power grid of a circuit design to be designed (at least initially) for functional power requirements and not power consumption by memory components during memory testing (e.g., via a MBIST). Accordingly, to ensure adequate support of power consumption by memory components under test, a circuit design flow for a physical circuit can involve designing or redesigning a power grid of the physical circuit with the memory-testing power consumption in mind. The design/redesign can aided or facilitated by a conventional process for estimating power (e.g., peak power) consumption by memory components of a circuit design representing the physical circuit. For example, the conventional process can comprise: inserting one or more MBISTs into the circuit design with respect one or more memory components of the circuit design; simulating each possible combination of parallel and serial schedules for performing memory algorithms on the one or more memory components via the one or more MBISTs; storing simulation results (e.g., in a value change database (VCD)); analyzing the simulation results for each simulation clock cycle and for all schedules performed; and generating power consumption (e.g., power dissipation) estimates for the one or more memory components by iterating through power numbers for each clock cycle to determine max power dissipation.

Unfortunately, conventional approaches for estimating power consumption of memory components under test can be very expensive in resources (e.g., memory and compute resources), can be runtime intensive (e.g., because analysis is performed over each simulation clock cycle, and there is a large number of possible combinations of test algorithm schedules), and can rely on a value change database (VCD)-base analysis, where the VCD size is proportional to number of memory components. As a result, conventional approaches (for estimating power consumption of memory components under test) can be impractical to use with certain circuit designs, such as those of system-on-chips (SoCs), which can have a large number of memory components (e.g., 100K+ memory components).

Various embodiments described herein can cure these and other deficiencies of conventional methods for estimating power (e.g., peak power) consumption by one or more memory components of a circuit design during memory testing. For example, some embodiments described herein can generate power estimates for one or more memory components under test: earlier in a circuit design flow than conventional approaches; faster than conventional approaches; with accuracy that is similar to conventional approaches; with better scalability (e.g., to handle larger scale circuit designs) than conventional approaches, or some combination thereof. Overall, the method for estimating power consumption by one or more memory cell instances of a circuit design can comprise: generating (e.g., creating) a wrapper for each memory library cell having at least one memory cell instance in the circuit design (e.g., which can include initializing one or more parameter values of the select wrapper instance based on one or more actual values determined for the select memory library cell instance from the circuit design); determining a set of toggle values and a set of probability values for pins within each wrapper;

determining power consumption (e.g, peak power consumption) of each memory cell instance using an instance of a corresponding wrapper (e.g., with parameter values initialized based on actual values from the circuit design), the set of toggle values of corresponding wrapper, and the set of probability values of corresponding wrapper; and analyzing and reporting estimated power consumption (e.g., estimated peak power consumption) of one or more memory cell instances of the circuit design for one or more different schedules for performing test algorithms on the one or more memory cell instances.

In particular, various embodiments determine a set of memory library cell instances of a circuit design (e.g., where the set comprises all or less than all memory library cell instances of the circuit designs), determine a set of memory library cells implementing the set of memory library cell instances, and generate (e.g., create) a set of wrappers for the set of memory library cells of a circuit design, where a wrapper is generated for each memory library cell of the set of memory library cells. For some embodiments, two or more wrappers of the set of wrappers are generated in parallel.

Subsequently, various embodiments determine (e.g., generate), for each individual wrapper in the set of wrappers, a toggle value and a probability value for each pin of the individual wrapper, where two or more pins of the individual wrapper can form a port of the individual wrapper. As a result, a set of toggle values and a set of probability values is determined (e.g., generated) for each individual wrapper. A toggle value of a pin can present a number of times a signal to the pin changes its value during a clock cycle; a toggle value can be set depending upon expected values of a signal to the pin during performance of a memory test by a MBIST. A probability value of a pin can comprise an average value of a signal to the pin in a clock cycle during a read operation or a write operation; a probability value can be set based on an average of expected values of a signal to the pin during performance of a memory test by a MBIST.

Thereafter, for each individual memory library cell instance (of the set of memory library cell instances), some embodiments use (a) a wrapper (from the set of wrappers) corresponding to a memory library cell of the individual memory library cell instance, (b) a set of toggle values of the wrapper (e.g., for all pins of the wrapper), (c) a set of probability values of the wrapper (e.g., for all pins of the wrapper), and (d) information from the circuit design for the individual memory library cell instance (e.g., parameters such as load, slew, capacitance of wires, and the like) to determine (e.g., calculate) a set of power consumption values (e.g., peak power consumption values) for the individual memory library cell instance, where the set of estimated power consumptions correspond to a set of ports of the individual memory library cell instance. Specifically, some embodiments determine the set of power consumptions for the individual memory library cell instance by applying a power estimation method (e.g., a method provides time-based power analysis of a circuit design, such as at the register-transfer level (RTL)) to simulate the individual memory library cell instance based on the wrapper, the set of toggle values of the wrapper, the set of probability values of the wrapper, and the information from the circuit design for the individual memory library cell instance. The power estimation method can comprise, for example, RTL importation and synthesis of a circuit design (e.g., circuit design encapsulated by an instance of a wrapper for a memory library cell), using one or more toggle values and probability values of pins (e.g., of the memory library cell) to analyze signal switching activity of pins, and using power models to calculate dynamic and static power consumption of circuit design components. An example of a power estimation method can include, without limitation, a Joules-based method or another statistical method to find power.

Afterward, some embodiments determine (e.g., calculate or estimate) estimated power consumption (e.g., a maximum power consumption or a peak power consumption) by all memory library cell instances of the set of memory library cell instances for one or more different schedules for performing a set of test algorithms on the set of memory library cell instances. This determination can be based on: (a) a set of power consumptions (e.g., peak power consumptions) of each memory library cell instance; (b) a memory type of each memory library cell instance; and (c) the set of test algorithms; and (d) one or more different configurations (e.g., parallel and serial configurations) for scheduling performance of the set of test algorithms.

By use of various embodiments described herein, peak power dissipation can be predicted/estimated early in a design flow of a circuit design comprising multiple memory library cell instances, which can assist (e.g., a user) in estimating a circuit design (e.g., SoC's) power requirements and can assist (e.g., the user) in selecting a schedule (e.g., order) of execution of test algorithms on one or more memory library cell instances of the circuit design by MBIST logic, where the select schedule can keep power consumption under the circuit design's power limits. With prediction/estimation of power consumption early in the design flow, some embodiment can obviate the need to iterate over each memory library cell instance for each test algorithm to determine power consumption values. Rather, predicted/estimated power values can be determined in less time (than conventional methods) and can avoid running all possible set of simulations. Given that some embodiments generate a single wrapper per a memory library cell, such embodiments can calculate power consumption for each instance of a given memory library cell using a corresponding, single wrapper by applying power parameter values associated with each instance. Additionally, power consumption (e.g., peak power consumption) for multiple (e.g., all) different memory library cells of a circuit design can be estimated in parallel. Various embodiments can avoid the generation and use of VCDs for estimating power consumption and, as such, can also obviate the need for storage space to store and process VCDs. Further, estimated power consumption values generated by various embodiments can be similar to those generated using conventional methods, such as those that use simulations based on VCD analysis.

As used herein, a cell library (or library) can refer to a collection of cells or components that a user (e.g., designer) can use to build a circuit design of a physical circuit. A library cell (or cell) can refer to a single component within a library (e.g., standard cell library), where the cell can be characterized for its electrical properties, such as timing, power, and noise behavior. Examples of cells include logic gates (e.g., such as NAND and NOR gates), multiplexers, flip-flops, adders, and complex components, such as a memory component or device represented as a memory library cell. Cells from a library can be used to build a circuit design of a physical circuit, such as an integrated circuit (IC).

As used herein, a memory component of a circuit design can comprise an instance of a memory library cell (also referred herein to as a memory library cell instance) A memory library cell can comprise an element of a cell library, and the element (of the cell library) can comprise a memory device (e.g., volatile or non-volatile memory device) configured to store data written to the memory device during a write operation, and configured to provide data stored on the memory device during a read operation.

As used herein, a memory built-in self-test (MBIST) (or MBIST logic) can comprise one or more hardware components that enables or facilitates testing (e.g., systematic testing) of writing data (e.g., data patterns) to, or reading data (e.g., data patterns) from, one or more memory components (e.g., memories). According to some embodiments, one or more MBISTs are inserted into a circuit design (e.g., by an EDA) to enable or facilitate testing of the one or more memory components of the circuit design. For instance, one or more MBISTs can be inserted into a circuit design of a SoC, where the one or more MBISTs can enable/facilitate testing of one or more memory components included by the SoC. A MBIST can comprise a controller (e.g., a built-in self-test (BIST) controller) configured to interact with one or more memory components, where interactions can be facilitated by one or more of a memory address generator (e.g., address generator), a data generator, and a comparator. One or more of the memory address generator, the data generator, and the comparator can form part of the MBIST.

As used herein, a wrapper cell (or wrapper) can comprise code (e.g., hardware description languages (HDLs), such as Verilog, System Verilog, and VHDL) or a schematic that encapsulates a library cell and that provides an interface to the library cell that is compatible with a particular design or tool. For some embodiments, a wrapper generated (e.g., created) with respect to a memory library cell adds one or more schematic pins that enable or facilitate a different simulation to be performed on the memory library cell for each individual instance of the memory library cell found within a circuit design.

Reference will now be made in detail to embodiments of the present disclosure, examples of which are illustrated in the appended drawings. The present disclosure may, however, be embodied in many different forms and should not be construed as being limited to the embodiments set forth herein.

Figure 1:
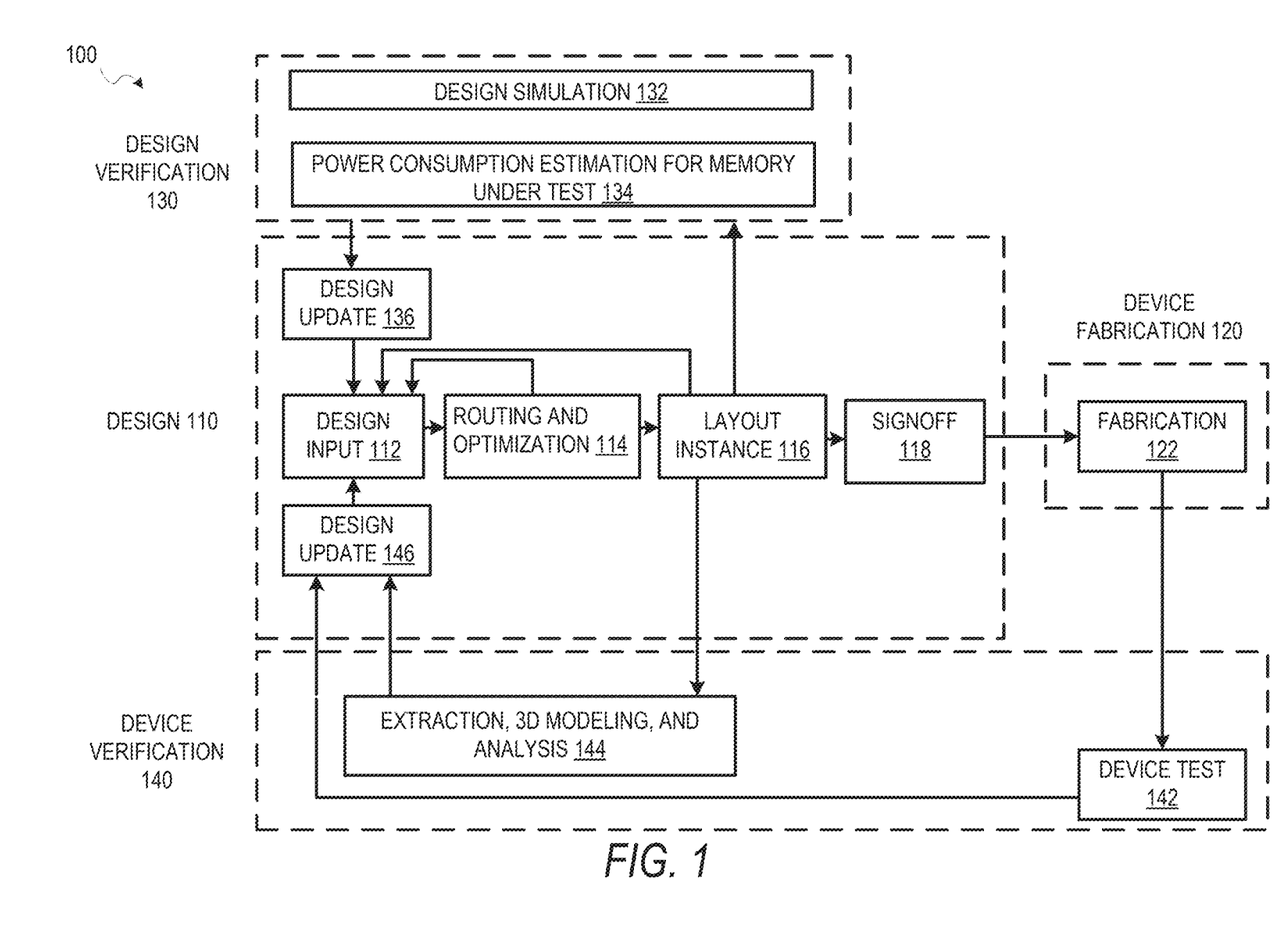
FIG. 1 is a diagram illustrating an example design process flow for estimating power consumption by one or more memory components of a circuit design during memory testing, according to some embodiments.

FIG. 1 is a diagram illustrating an example design process flow 100 for estimating power consumption by one or more memory components of a circuit design during memory testing, according to some embodiments. As shown, the design process flow 100 includes a design phase 110, a device fabrication phase 120, a design verification phase 130, and a device verification phase 140. The design phase 110 involves an initial design input 112 operation where the basic elements and functionality of a device are determined, as well as revisions based on various analyses and optimization of a circuit design. This design input 112 operation is where block instances are used in the circuit design and any additional circuitry for the design around the blocks is selected. The initial strategy, tactics, and context for the device to be created are also generated in the design input 112 operation, depending on the particular design algorithm to be used.

In some embodiments, following an initial selection of design values in the design input 112 operation, routing, timing analysis, and optimization are performed in a routing and optimization 114 operation, along with any other automated design processes. The routing and optimization 114 operation may also include other operations not shown, such as those relating to floor planning, placement, post-placement optimization, and post-routing optimization.

While the design process flow 100 shows optimization occurring prior to a layout instance 116, timing analysis and optimization may be performed at any time to verify operation of a circuit design. For instance, in various embodiments, timing analysis in a circuit design may be performed prior to routing of connections in the circuit design; after routing, during register transfer level (RTL) operations; or as part of a signoff 118, as described below.

Design inputs are used in the design input 112 operation to generate an initial circuit layout. The design inputs may be further processed during the design input 112 operation via a process, such as logic-synthesis, to generate a circuit netlist mapped to a target standard library manufacturable by the foundry in a fabrication 122 operation. After design inputs are used in the design input 112 operation to generate an initial Circuit layout, and any of the routing and optimization 114 operations are performed, a resulting layout is generated as the layout instance 116. The netlist, as placed by the layout instance 116, describes the physical layout dimensions of the device that match the design inputs. Prior to this layout being provided to a fabrication 122 operation, the signoff 118 is performed on the circuit design defined by the layout.

After signoff verification by the signoff 118, a verified version of the layout is used in the fabrication 122 operation to generate a device, or additional testing and design updates may be performed using designer inputs or automated updates based on design simulation 132 operations or extraction, 3D modeling, and analysis 144 operations Once the device is generated, the device can be tested as part of device test 142 operations and layout modifications generated based on actual device performance A design update 136 based on the design verification phase 130, a design update 146 from the device test 142 operations or the extraction, 3D modeling, and analysis 144 operations, or the design input 112 operation may occur after the initial layout instance 116 is generated. In various embodiments, whenever design inputs are used to update or change an aspect of a circuit design, a timing analysis and the routing and optimization 114 operations may be performed.

As shown, the design verification phase 130 includes a power consumption estimation for memory under test 134 operation, which can be configured to estimate power consumption by one or more memory components (e.g., memory library cell instances) of a circuit design during memory testing, in accordance with various embodiment described herein.

Figure 2:
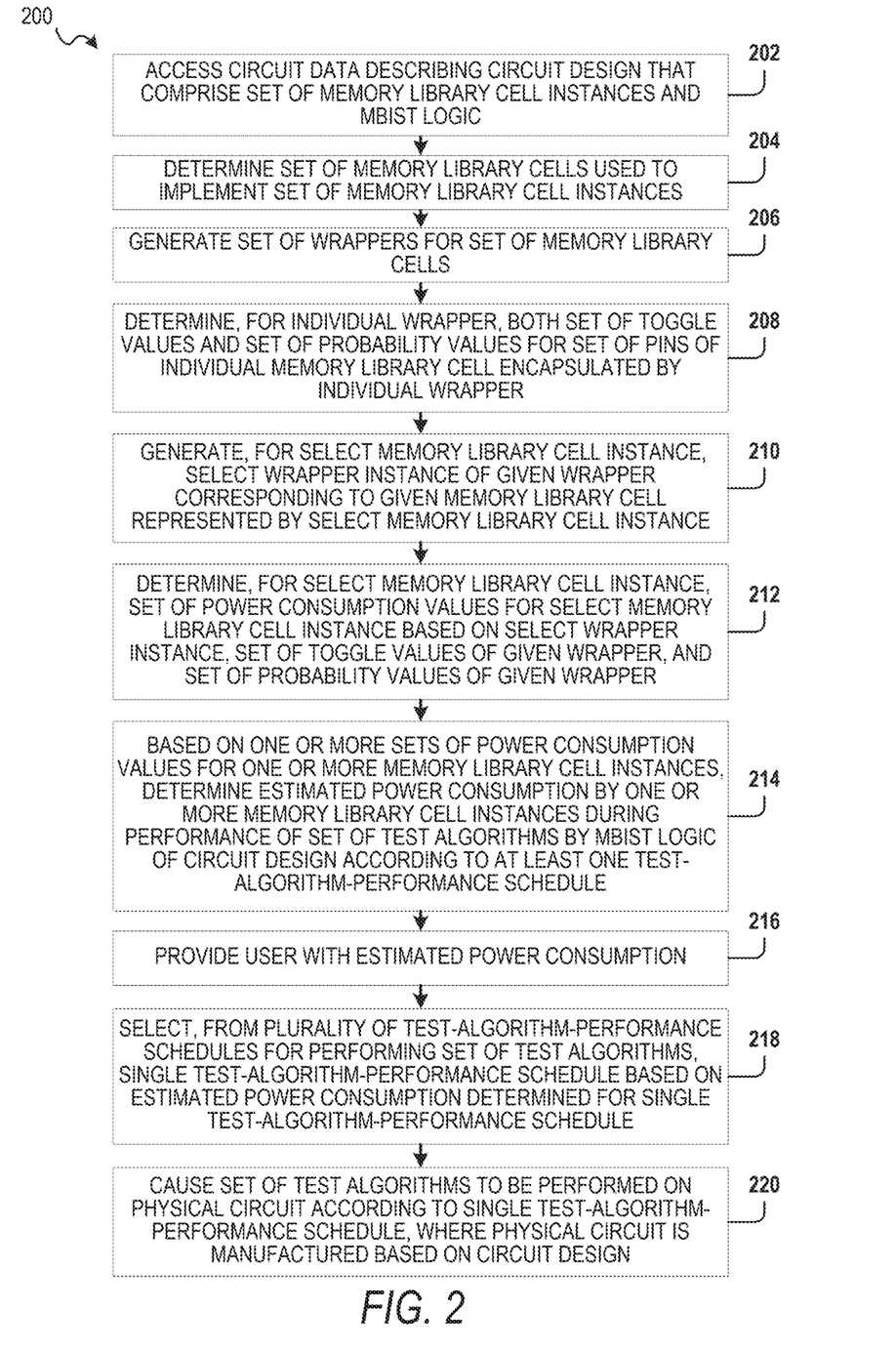
FIG. 2 is a flowchart illustrating an example method for estimating power consumption by one or more memory components of a circuit design during memory testing, according to some embodiments.

FIG. 2 is a flowchart illustrating an example method 200 for estimating power consumption by one or more memory components of a circuit design during memory testing, according to some embodiments. It will be understood that example methods described herein may be performed by a device, such as a computing device executing instructions of an EDA software system, in accordance with some embodiments. Additionally, example methods described herein may be implemented in the form of executable instructions stored on a computer-readable medium or in the form of electronic circuitry. For instance, the operations of method 200 of FIG. 2 may be represented by executable instructions that, when executed by a processor of a computing device, cause the computing device to perform method 200. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. An operation of method 200 (or another method described herein) may be performed by a hardware processor (e.g., central processing unit or graphics processing unit) of a computing device (e.g., desktop, server, etc.). Depending on the embodiment, method 200 can be performed during (e.g., as part of) or after memory built-in self-test (MBIST) logic is inserted into a circuit design (e.g., for a SoC) that comprises one or more memory library cell instances.

As illustrated, at operation 202, circuit data describing a circuit design is accessed, where the circuit design comprises the set of memory library cell instances and memory built-in self-test (MBIST) logic. For some embodiments, the MBIST logic is configured to perform at least one test on at least one memory library cell instance (of the set of memory library cell instances) of the circuit design.

During operation 204, a set of memory library cells used to implement the set of memory library cell instances (of the circuit design) is determined. Then, at operation 206, a set of wrappers for the set of memory library cells is generated. According to some embodiments, operation 206 comprises generating an individual wrapper for an individual memory library cell (e.g., generating a single wrapper for each individual memory library cell) of the set of memory library cells, where the individual wrapper (of the individual memory library cell) encapsulates the individual memory library cell. During generation of the set of wrappers for the set of memory library cells, two or more wrappers (of the set of wrappers) can be generated in parallel, which can avoid extra/additional runtime of method 200. By operation 206, various embodiments can avoid making any changes in the circuit design to estimate power consumption by the set of memory library cell instances during performance of a set of test algorithms on the set of memory library cell instances according to a test-algorithm-performance schedule (e.g., order for performing the set of test algorithm).

Operation 208 determines (e.g., setting), for an individual wrapper of the set of wrappers, a set of toggle values for a set of pins of an individual memory library cell of the set of memory library cells, and determines a set of probability values for the set of pins (of the individual memory library cell), where the individual memory library cell is encapsulated by the individual wrapper. For various embodiments, different toggle values and different probability values are determined for read operations performed on memory library cell instances and write operations performed on memory library cell instances. For some embodiments, operation 208 comprises determining the set of toggle values (for the set of pins of the individual memory library cell) by at least one of: determining a toggle value of zero for a pin of the set of pins that receives a constant signal value; determining a toggle value of zero for a pin of the set of pins that is unused by any test performed by the MBIST logic; determining a toggle value based on a clock frequency (e.g., toggle value is determined to be clock frequency (in Hz) of a clock signal of the circuit design, as such controlled pins are toggled once per a clock cycle for some embodiments) for a pin of the set of pins that is used by the at least one test performed by the MBIST logic (e.g., pins controlled by the MBIST logic during the at least one test); or determining a toggle value based on the clock frequency (e.g, toggle value is determined to be 2*clock frequency (in Hz) of a clock signal of the circuit design, as clock pins goggle twice per a clock cycle for some embodiments) for a pin of the set of pins that receives a clock signal. Additionally, for some embodiments, operation 208 comprises determining the set of probability values (for the set of pins of the individual memory library cell) by at least one of: determining a probability value of 0.5 for a pin of the set of pins that receives a clock signal; determining a probability value of zero for a pin of the set of pins that receives a constant signal value of zero; determining a probability value of disabled state (e.g., ENABLED STATE (0/1), where a pin is said to be in DISABLED state of 0 by setting 0 to the pin, or vice versa) for a pin of the set of pins that is unused by any test performed by the MBIST logic; determining a probability value of enabled state (e.g., ENABLED STATE (0/1), where a pin is said to be in ENABLED state of 1 by setting 1 to the pin, or vice versa) for a pin of the set of pins that is used by the at least one test performed by the MBIST logic (e.g., pins controlled by the MBIST logic during the at least one test); or determining a probability value of 0.5 for a pin of the set of pins that receives memory address data. According to some embodiments, operation 208 is performed for each individual wrapper of the set of wrappers. By determining (e.g., setting) the set of toggle values and the set of probability values for an (e.g., each) individual wrapper, various embodiments can avoid determining (e.g., setting) the set of toggle values and the set of probability values for an entirety of the circuit design (which can be very runtime intensive).

For a select memory library cell instance of the set of memory library cell instances, a select wrapper instance of a given wrapper (from the set of wrappers generated by operation 206) is generated at operation 210, where the given wrapper corresponds to a given memory library cell represented by the select memory library cell instance. For some embodiments, operation 210 comprises determining one or more actual values of the select memory library cell instance from the circuit design, and initializing one or more parameter values of the select wrapper instance based on the one or more actual values. For example, the one or more parameter values can comprise values for one or more power parameters, where the one or more parameter values can comprise at least one of a value for a slew parameter or a value for a capacitance parameter. By initializing one or more parameter values of the select wrapper instance, various embodiments can incorporate instance-specific information from the circuit design into the select wrapper instance to estimate power consumption for the memory library cell instance based on a set of toggle values and a set of probability values determined for the select wrapper instance. According to some embodiments, operation 210 is performed for each select memory library cell instance of the set of memory library cell instances. Additionally, operation 210 can be performed in parallel for two or more select memory library cell instances.

For operation 212, a set of power consumption values is determined for the select memory library cell instance based on: the select wrapper instance (corresponding to the select memory library cell instance); the set of toggle values of the given wrapper (e.g., as determined by operation 208); and the set of probability values of the given wrapper (e.g., as determined by operation 208). For some embodiments, operation 212 comprises determining the set of power consumption values based on the select wrapper instance comprises determining the set of power consumption values based on one or more parameter (e.g., slew, capacitance) values of the select wrapper instance (e.g., as initialized during generation of the select wrapper instance by operation 210). For some embodiments, the set of power consumption values (for the select memory library cell instance) can comprise one or more power consumption values for one or more pins of the select memory library cell instance. For example, the set of power consumption values can comprise one or more peak power consumption values. For some embodiments, operation 212 comprises applying a power estimation method to the select wrapper instance based on the set of toggle values and the set of probability values. An example power estimation method includes, without limitation, a Joules-based method. According to some embodiments, the set of power consumption values (for the select memory library cell instance) comprises one or more power consumption values for one or more ports of the select memory library cell instance, where each port comprises two or more pins of the select memory library cell instance. In this way, some embodiments provide power consumption (e.g., peak power consumption) per a port for the select memory library cell instance (corresponding to the select memory library cell instance). Example ports can include, without limitation, an address port (e.g, to specify a memory address for a memory operation), a write port (e.g, to facilitate a memory write operation), and a read port (e.g., to facilitate a memory read operation). According to some embodiments, operation 212 is performed for each select memory library cell instance of the set of memory library cell instances. Additionally, operation 212 can be performed in parallel for two or more select memory library cell instances. For operation 212, one or more power consumption values can be determined (e.g., calculated) per memory read port or per write port, and can be determined based on a first set of toggle values and a first set of probability values for read operations, and based on a second set of toggle values and a second set of probability values for write operations.

Based on one or more sets of power consumption values (generated by operation 212) for one or more memory library cell instances of the set of memory library cell instances, operation 214 determines an estimated power consumption by the one or more memory library cell instances during performance of a set of test algorithms, where the set of test algorithms is performed by memory built-in self-test (MBIST) logic of the circuit design according to at least one test-algorithm-performance schedule. For some embodiments, the estimated power consumption comprises an estimated peak power consumption value. For instance, operation 214 can determine an estimated power consumption (e.g., estimated peak power consumption) per read port or per write port (of the one or more memory library cell instances) for any given schedule of performing a set of test algorithms on the one or more memory library cell instances.

During operation 216, a user is provided with the estimated power consumption generated by operation 214. For some embodiments, operation 216 comprises causing the estimated power consumption to be displayed to the user by a hardware display (e.g., operatively coupled to an EDA software system). The user can be a person, such as a circuit engineer/designer, who can decide on a test-algorithm-performance schedule that keeps power consumption by one or more memory library cell instances, during performance of the one or more test algorithms, under a certain power limit (e.g., power limit determined based on what the circuit design's power grid currently supports). Additionally, or alternatively, the user can be a person who can decide to redesign at least some portion of the circuit design's power grid to ensure sufficient power support for a test-algorithm-performance schedule for the set of test algorithms.

At operation 218, at least one test-algorithm-performance schedule is selected, from a plurality of test-algorithm-performance schedules for performing the set of test algorithms, based on an estimated power consumption determined for the at least one test-algorithm-performance schedule (e.g., based on the estimated power consumption and a selection criterion, such as selecting a schedule associated with a lowest estimated peak power consumption). Selection of the at least one test-algorithm-performance schedule can be facilitated, for example, by a user that reviews the plurality of test-algorithm-performance schedules and corresponding estimated power consumptions through a hardware display (e.g., a graphical user interface (GUI) displayed thereon), and selects the at least one test-algorithm-performance schedule (e.g., through the graphical user interface). Alternatively, or additionally, selection of the at least one test-algorithm-performance schedule can be facilitated by an automatic process configured to analyze the plurality of test-algorithm-performance schedules and corresponding estimated power consumptions, and configured to select the at least one test-algorithm-performance schedule based on an associated estimated power consumption being the lowest.

Operation 220 causes the set of test algorithms to be performed on a physical circuit according to the at least one test-algorithm-performance schedule (e.g., selected by operation 218), where the physical circuit is manufactured based on the circuit design. For instance, the physical circuit can be manufactured (e.g., during the fabrication 122 operation of FIG. 1) based on the circuit design (e.g., after the signoff 118 operation), and a MBIST logic of the physical circuit can be accessed to cause the set of test algorithms to be performed on the physical circuit according to the at least one test-algorithm-performance schedule.

Figure 3:
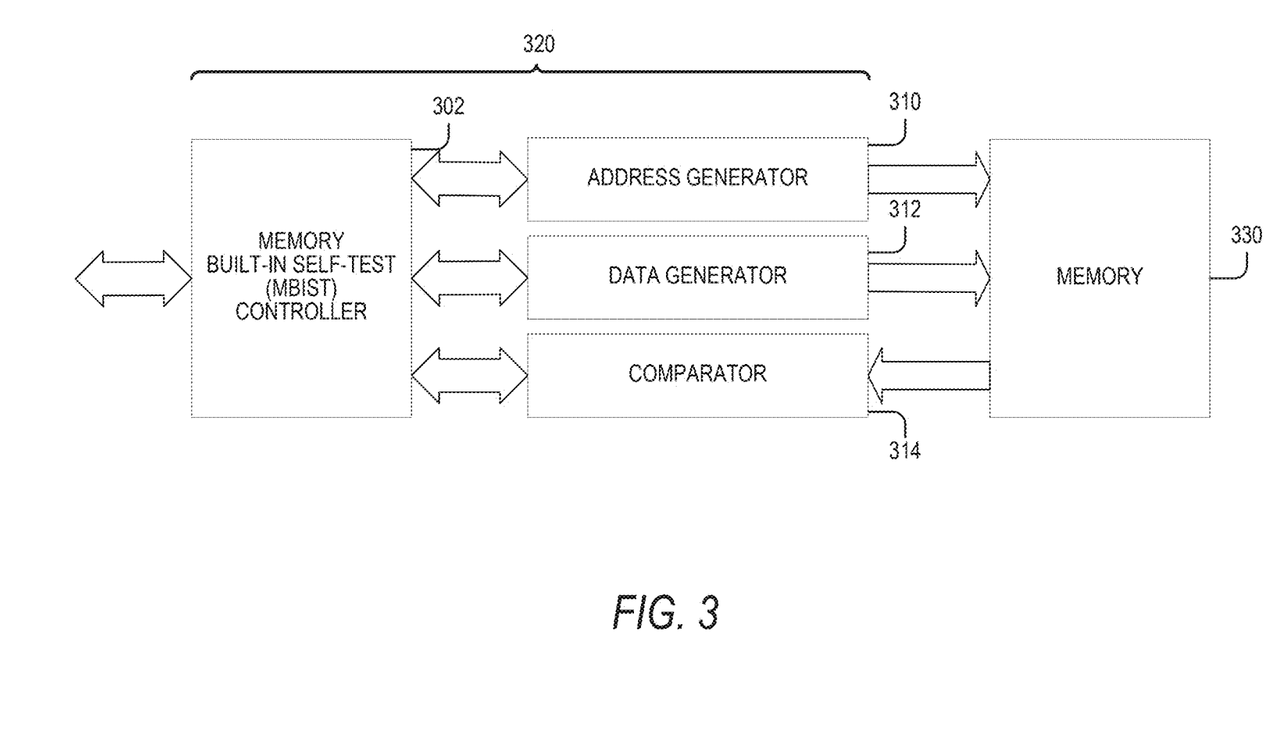
FIG. 3 is a diagram illustrating an example architecture of a memory built-in self-test (MBIST) logic operatively coupled to memory, according to some embodiments.

FIG. 3 is a diagram illustrating an example architecture of a memory built-in self-test (MBIST) logic 320 operatively coupled to memory 330, according to some embodiments. As shown, the memory built-in self-test (MBIST) logic 320 comprises a memory built-in self-test (MBIST) controller 302, an address generator 310, a data generator 312, and a comparator 314. For some embodiments, the memory 330 comprises (e.g., is implemented by) one or more instances (memory library cell instances) of a memory library cell instances. According to various embodiments, the MBIST controller 302 is operatively coupled to the address generator 310, the data generator 312, and the comparator 314, to facilitate (e.g., control) performance of one or more test algorithms on one or more memory library cell instances of the memory 330. For some embodiments, one or more test algorithms is performed on the one or more memory library cell instances (of the memory 330) according to a schedule for which some embodiments determine an estimated power consumption by the memory 330.

Figure 4:
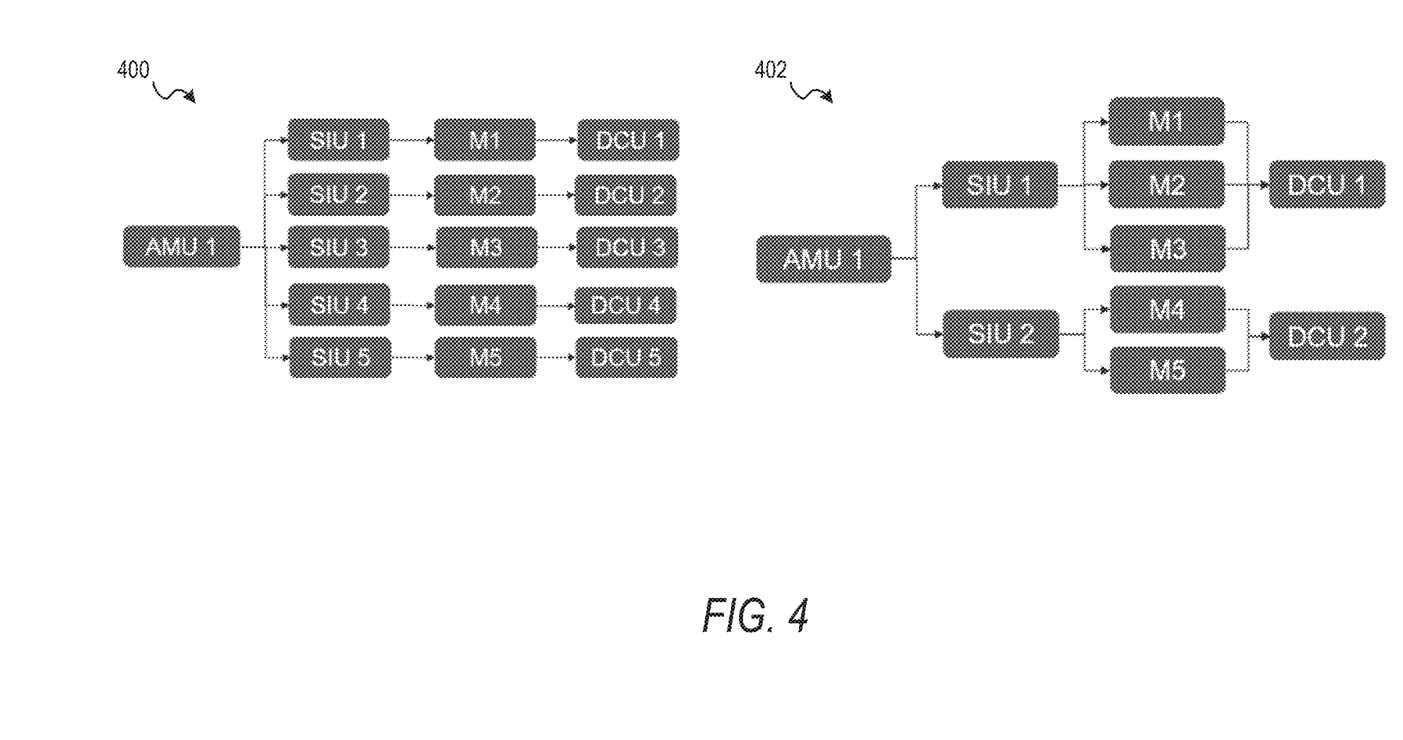
FIG. 4 is a diagram illustrating example schedules for which some embodiments can determine estimated power consumptions by one or more memory library cell instances.

FIG. 4 is a diagram illustrating example schedules 400, 402 for which some embodiments can determine estimated power consumptions by one or more memory library cell instances. For schedules 400, 402, AMU represents an algorithm memory unit, DCU represents a data comparator unit, SIU represents a sequence iterator unit, and M #represents a memory library cell instance. In FIG. 4, schedule 400 can represent maximum parallelization of performing test algorithms on memory library cell instances (represented by M1, M2, M3, M4, M5), while schedule 402 can represent maximum serialization of performing test algorithms on memory library cell instances (represented by M1, M2, M3, M4, M5). For schedule 400, any combination of memories (M1 through M5) can be tested in parallel According to schedule 402, the memory library cell instances M1, M2, M3 is run in series due to shared use of DCU1, the memory library cell instances M4, M5 is run in series due to shared use of DCU2, and any combination of memory library cell instances M1/M2/M3 can be tested in parallel with any combination of memory library cell instances M4/M5 tested in parallel.

Figure 5:
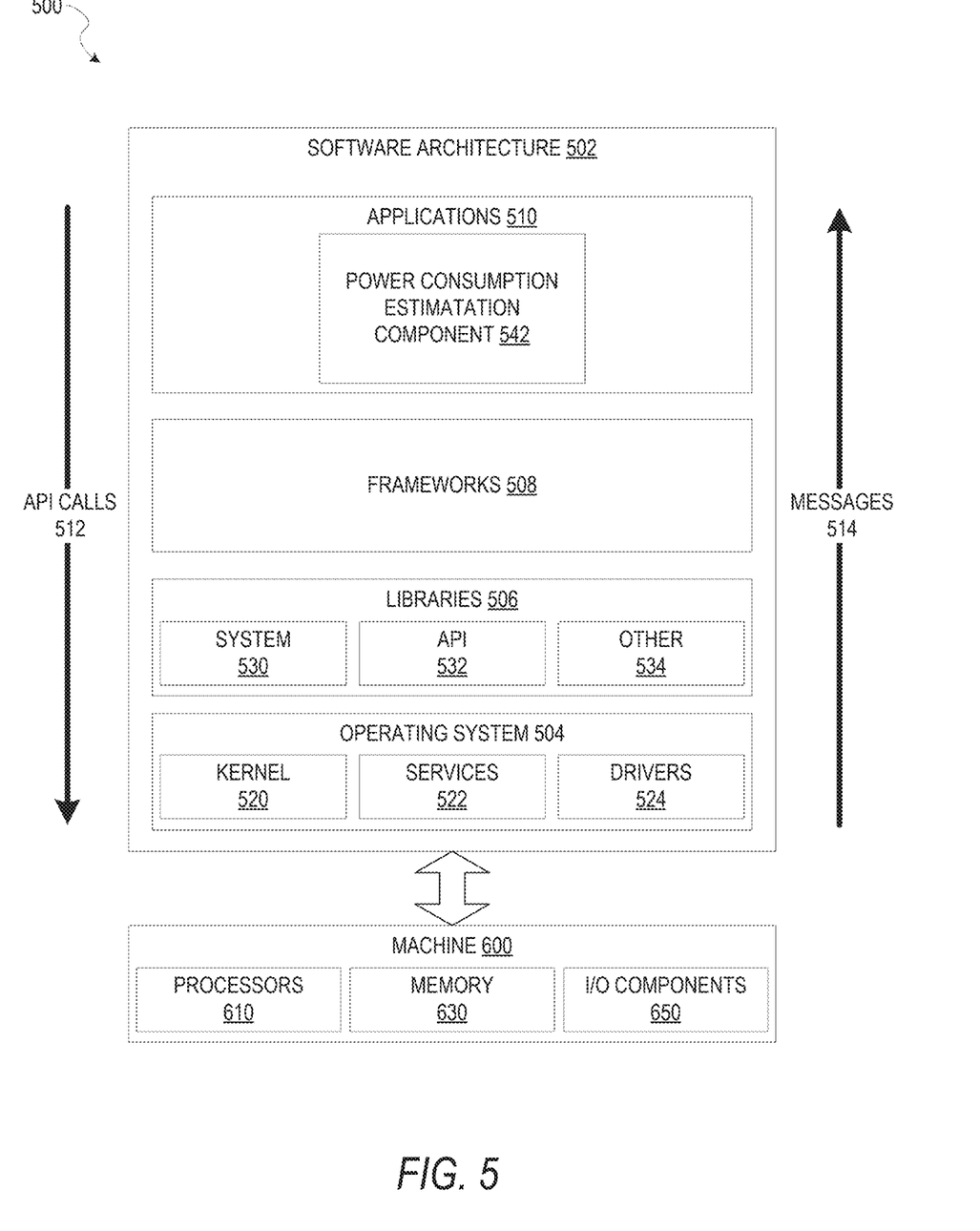
FIG. 5 is a block diagram illustrating an example of a software architecture that may be operating on an EDA computer and may be used with methods for estimating power consumption by one or more memory components of a circuit design during memory testing, according to some embodiments.

FIG. 5 is a block diagram 500 illustrating an example of a software architecture 502 that may be operating on an EDA computer and may be used with methods for estimating power consumption by one or more memory components of a circuit design during memory testing, according to some embodiments. The software architecture 502 can be used as an EDA computing device to implement any of the methods described above. Aspects of the software architecture 502 may, in various embodiments, be used to store circuit designs, and to facilitate generation of a circuit design in an EDA environment by estimating power consumption by one or more memory components of a circuit design during memory testing.

FIG. 5 is merely a non-limiting example of a software architecture 502, and it will be appreciated that many other architectures can be implemented to facilitate the functionality described herein. In various embodiments, the software architecture 502 is implemented by hardware such as a machine 600 of FIG. 6 that includes processors 610 (e.g., hardware processors), memory 630, and input/output (I/O) components 650. In this example, the software architecture 502 can be conceptualized as a stack of layers where each layer may provide a particular functionality. For example, the software architecture 502 includes layers such as an operating system 504, libraries 506, software frameworks 508, and applications 510. Operationally, the applications 510 invoke application programming interface (API) calls 512 through the software stack and receive messages 514 in response to the API calls 512, consistent with some embodiments. In various embodiments, any client device, any server computer of a server system, or any other device described herein may operate using elements of the software architecture 502. An EDA computing device described herein may additionally be implemented using aspects of the software architecture 502, with the software architecture 502 adapted for estimating power consumption by one or more memory components of a circuit design during memory testing in any manner described herein.

Figure 6:
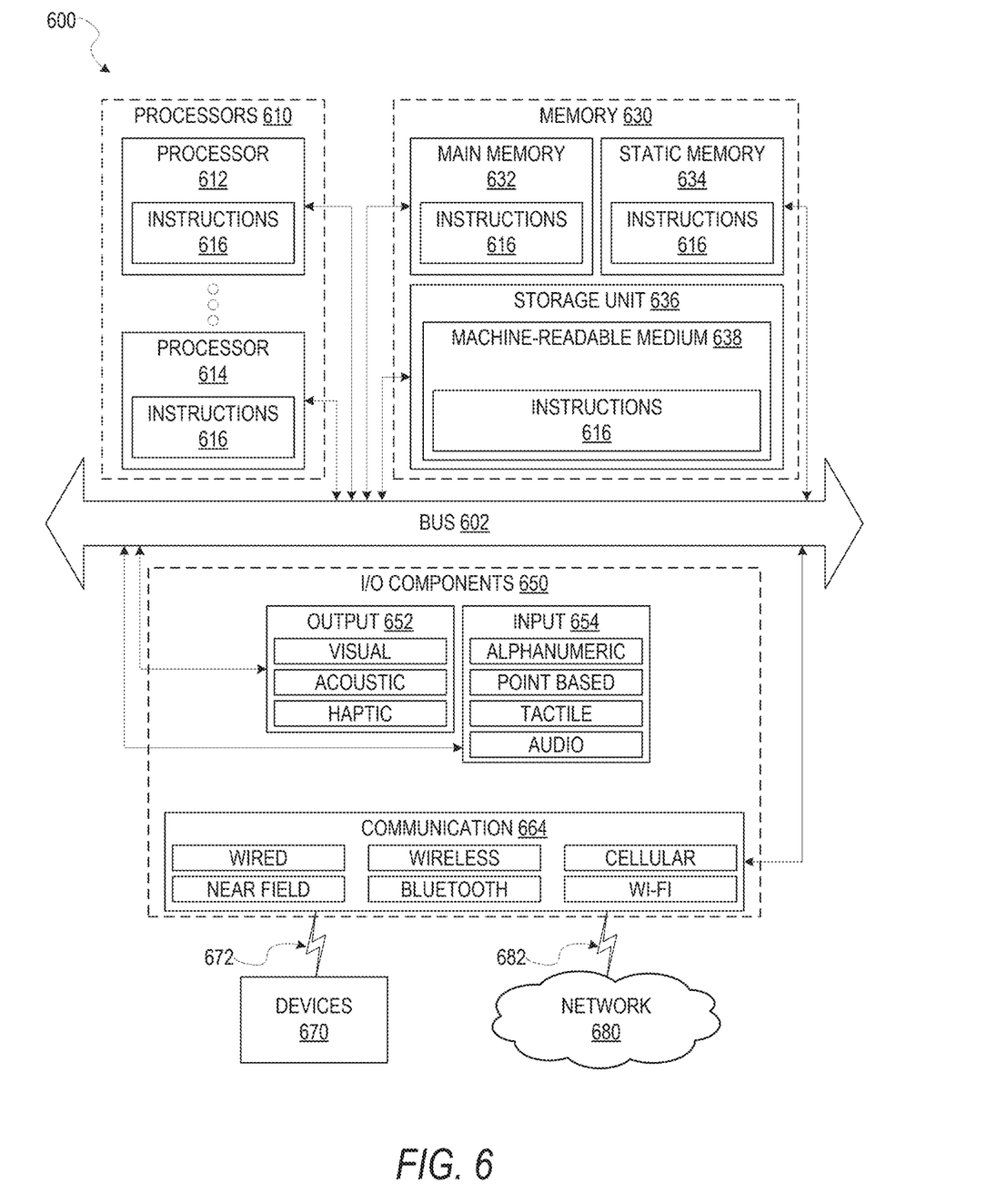
FIG. 6 is a diagrammatic representation of the machine in the form of a computer system within which a set of instructions may be executed for causing the machine to perform any one or more of the methodologies discussed herein, according to some embodiments.

In some embodiments, an EDA application of the applications 510 estimates power consumption by one or more memory components of a circuit design during memory testing according to embodiments described herein using various components within the software architecture 502. For example, in some embodiments, an EDA computing device similar to the machine 600 includes the memory 630 and the one or more processors 610. The processors 610 also implement power consumption estimation component 542 for estimating power consumption by one or more memory components of a circuit design during memory testing, in accordance with various embodiments described herein.

In various other embodiments, rather than being implemented as components of the one or more applications 510, the power consumption estimation component 542 may be implemented using elements of the libraries 506, the operating system 504, or the software frameworks 508.

In various implementations, the operating system 504 manages hardware resources and provides common services. The operating system 504 includes, for example, a kernel 520, services 522, and drivers 524. The kernel 520 acts as an abstraction layer between the hardware and the other software layers, consistent with some embodiments. For example, the kernel 520 provides memory management, processor management (e.g., scheduling), component management, networking, and security settings, among other functionalities. The services 522 can provide other common services for the other software layers. The drivers 524 are responsible for controlling or interfacing with the underlying hardware, according to some embodiments. For instance, the drivers 524 can include display drivers, signal-processing drivers to optimize modeling computation, memory drivers, serial communication drivers (e.g., Universal Serial Bus (USB) drivers), WI-FI® drivers, audio drivers, power management drivers, and so forth.

In some embodiments, the libraries 506 provide a low-level common infrastructure utilized by the applications 510. The libraries 506 can include system libraries 530 such as libraries of blocks for use in an EDA environment or other libraries that can provide functions such as memory allocation functions, string manipulation functions, mathematic functions, and the like. In addition, the libraries 506 can include API libraries 532 such as media libraries (e.g., libraries to support presentation and manipulation of various media formats such as Joint Photographic Experts Group (JPEG or JPG), or Portable Network Graphics (PNG)), graphics libraries (e.g., an OpenGL framework used to render in 2D and 3D in a graphic context on a display), database libraries (e.g., SQLite to provide various relational database functions), web libraries (e.g., WebKit to provide web browsing functionality), and the like. The libraries 506 may also include other libraries 534.

The software frameworks 508 provide a high-level common infrastructure that can be utilized by the applications 510, according to some embodiments. For example, the software frameworks 508 provide various graphic user interface (GUI) functions, high-level resource management, high-level location services, and so forth. The software frameworks 508 can provide a broad spectrum of other APIs that can be utilized by the applications 510, some of which may be specific to a particular operating system 504 or platform. In various embodiments, the systems, methods, devices, and instructions described herein may use various files, macros, libraries, and other elements of an EDA design environment to implement estimation of power consumption by one or more memory components of a circuit design during memory testing as described herein. This includes analysis of input design files for an integrated circuit design, along with any element of hierarchical analysis that may be used as part of or along with the embodiments described herein. While netlist files, library files, SDC files, and view definition files are examples that may operate within the software architecture 502, it will be apparent that other files and structures may provide a similar function, in various embodiments.

Certain embodiments are described herein as including logic or a number of components, modules, elements, or mechanisms. Such components can constitute either software components (e.g., code embodied on a machine-readable medium or in a transmission signal) or hardware components. A "hardware component" is a tangible unit capable of performing certain operations and can be configured or arranged in a certain physical manner. In various embodiments, one or more computer systems (e.g., a stand-alone computer system, a client computer system, or a server computer system) or one or more hardware components of a computer system (e.g., a processor or a group of processors) are configured by software (e.g., an application or application portion) as a hardware component that operates to perform certain operations as described herein.

In some embodiments, a hardware component is implemented mechanically, electronically, or any suitable combination thereof. For example, a hardware component can include dedicated circuitry or logic that is permanently configured to perform certain operations. For example, a hardware component can be a special-purpose processor, such as a field-programmable gate array (FPGA) or an application-specific integrated circuit (ASIC). A hardware component may also include programmable logic or circuitry that is temporarily configured by software to perform certain operations. For example, a hardware component can include software encompassed within a general-purpose processor or other programmable processor. It will be appreciated that the decision to implement a hardware component mechanically, in dedicated and permanently configured circuitry, or in temporarily configured circuitry (e.g., configured by software) can be driven by cost and time considerations.

Accordingly, the phrase "component" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware components are temporarily configured (e.g., programmed), each of the hardware components need not be configured or instantiated at any one instance in time. For example, where a hardware component comprises a general-purpose hardware processor configured by software to become a special-purpose processor, the general-purpose processor may be configured as respectively different special-purpose processors (e.g., comprising different hardware components) at different times. Software can accordingly configure a particular processor or processors, for example, to constitute a particular hardware component at one instance of time and to constitute a different hardware component at a different instance of time.

Hardware components can provide information to, and receive information from, other hardware components. Accordingly, the described hardware components can be regarded as being communicatively coupled. Where multiple hardware components exist contemporaneously, communications can be achieved through signal transmission (e.g., over appropriate circuits and buses) between or among two or more of the hardware components. In embodiments in which multiple hardware components are configured or instantiated at different times, communications between or among such hardware components may be achieved, for example, through the storage and retrieval of information in memory structures to which the multiple hardware components have access. For example, one hardware component performs an operation and stores the output of that operation in a memory device to which it is communicatively coupled. A further hardware component can then, at a later time, access the memory device to retrieve and process the stored output. Hardware components can also initiate communications with input or output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented components that operate to perform one or more operations or functions described herein. As used herein, "processor-implemented component" refers to a hardware component implemented using one or more processors.

Similarly, the methods described herein can be at least partially processor-implemented, with a particular processor or processors being an example of hardware. For example, at least some of the operations of a method can be performed by one or more processors or processor-implemented components. Moreover, the one or more processors may also operate to support performance of the relevant operations in a "cloud computing" environment or as a "software as a service" (SaaS). For example, at least some of the operations may be performed by a group of computers (as examples of machines 600 including processors 610), with these operations being accessible via a network (e.g., the Internet) and via one or more appropriate interfaces (e.g, an API). In certain embodiments, for example, a client device may relay or operate in communication with cloud computing systems and may access circuit design information in a cloud environment.

The performance of certain of the operations may be distributed among the processors, not only residing within a single machine 600, but deployed across a number of machines 600. In some embodiments, the processors 610 or processor-implemented components are located in a single geographic location (e.g., within a home environment, an office environment, or a server farm). In some other embodiments, the processors or processor-implemented components are distributed across a number of geographic locations.

FIG. 6 is a diagrammatic representation of the machine 600 in the form of a computer system within which a set of instructions may be executed for causing the machine 600 to perform any one or more of the methodologies discussed herein, according to some embodiments. FIG. 6 shows components of the machine 600, which is, according to some embodiments, able to read instructions from a machine-readable medium (e.g., a machine-readable storage medium) and perform any one or more of the methodologies discussed herein. Specifically, FIG. 6 shows a diagrammatic representation of the machine 600 in the example form of a computer system, within which instructions 616 (e.g., software, a program, an application, an applet, an app, or other executable code) for causing the machine 600 to perform any one or more of the methodologies discussed herein can be executed. In alternative embodiments, the machine 600 operates as a standalone device or can be coupled (e.g, networked) to other machines. In a networked deployment, the machine 600 may operate in the capacity of a server machine or a client machine in a server-client network environment, or as a peer machine in a peer-to-peer (or distributed) network environment. The machine 600 can comprise, but not be limited to, a server computer, a client computer, a personal computer (PC), a tablet computer, a laptop computer, a netbook, or any machine capable of executing the instructions 616, sequentially or otherwise, that specify actions to be taken by the machine 600. Further, while only a single machine 600 is illustrated, the term "machine" shall also be taken to include a collection of machines 600 that individually or jointly execute the instructions 616 to perform any one or more of the methodologies discussed herein.

In various embodiments, the machine 600 comprises processors 610, memory 630, and I/O components 650, which can be configured to communicate with each other via a bus 602. In some embodiments, the processors 610 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another, or any suitable combination thereof) include, for example, a processor 612 and a processor 614 that may execute the instructions 616. The term "processor" is intended to include multi-core processors 610 that may comprise two or more independent processors 612, 614 (also referred to as "cores") that can execute the instructions 616 contemporaneously. Although FIG. 6 shows multiple processors 610, the machine 600 may include a single processor 612 with a single core, a single processor 612 with multiple cores (e.g., a multi-core processor 612), multiple processors 610 with a single core, multiple processors 610 with multiple cores, or any combination thereof.

The memory 630 comprises a main memory 632, a static memory 634, and a storage unit 636 accessible to the processors 610 via the bus 602, according to some embodiments. The storage unit 636 can include a machine-readable medium 638 on which are stored the instructions 616 embodying any one or more of the methodologies or functions described herein. The instructions 616 can also reside, completely or at least partially, within the main memory 632, within the static memory 634, within at least one of the processors 610 (e.g., within the processor's cache memory), or any suitable combination thereof, during execution thereof by the machine 600. Accordingly, in various embodiments, the main memory 632, the static memory 634, and the processors 610 are considered machine-readable media 638.

As used herein, the term "memory" refers to a machine-readable medium 638 able to store data temporarily or permanently and may be taken to include, but not be limited to, random-access memory (RAM), read-only memory (ROM), buffer memory, flash memory, and cache memory. While the machine-readable medium 638 is shown, in some embodiments, to be a single medium, the term "machine-readable medium" should be taken to include a single medium or multiple media (e.g., a centralized or distributed database, or associated caches and servers) able to store the instructions 616. The term "machine-readable medium" shall also be taken to include any medium, or combination of multiple media, that is capable of storing instructions (e.g., the instructions 616) for execution by a machine (e.g., the machine 600), such that the instructions, when executed by one or more processors of the machine (e.g., the processors 610), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

The I/O components 650 include a wide variety of components to receive input, provide output, produce output, transmit information, exchange information, capture measurements, and so on. In general, it will be appreciated that the I/O components 650 can include many other components that are not shown in FIG. 6. The I/O) components 650 are grouped according to functionality merely for simplifying the following discussion, and the grouping is in no way limiting. In various embodiments, the I/O components 650 include output components 652 and input components 654. The output components 652 include visual components (e.g., a display (or hardware display) such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 654 include alphanumeric input components (e.g., a keyboard, a touch screen configured to receive alphanumeric input, a photo-optical keyboard, or other alphanumeric input components), point-based input components (e.g., a mouse, a touchpad, a trackball, or other pointing instruments), tactile input components (e.g, a physical button, a touch screen that provides location and force of touches or touch gestures, or other tactile input components), audio input components (e.g., a microphone), and the like.

In some embodiments, outputs from an EDA computing device may include design documents, files for additional steps in a design flow, or outputs for circuit fabrication. As described herein, "constraints," "requirements," "design elements," and other aspects of a circuit design refer to selectable values that are set as part of the design of a circuit. Such design constraints, requirements, or elements may be adjusted by a system operator or circuit designer to suit the particular goals of a project or circuit that results from the operations described herein.

Communication can be implemented using a wide variety of technologies. The I/O components 650 may include communication components 664 operable to couple the machine 600 to a network 680 or devices 670 via a coupling 682 and a coupling 672, respectively. For example, the communication components 664 include a network interface component or another suitable device to interface with the network 680. In further examples, the communication components 664 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 670 may be another machine or any of a wide variety of peripheral devices (e.g., a peripheral device coupled via a USB).

In various embodiments, one or more portions of the network 680 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the public switched telephone network (PSTN), a plain old telephone service (POTS) network, a cellular telephone network, a wireless network, a WI-FI® network, another type of network, or a combination of two or more such networks. For example, the network 680 or a portion of the network 680 may include a wireless or cellular network, and the coupling 682 may be a Code Division Multiple Access (CDMA) connection, a Global System for Mobile communications (GSM) connection, or another type of cellular or wireless coupling.

Furthermore, the machine-readable medium 638 is non-transitory (in other words, not having any transitory signals) in that it does not embody a propagating signal. However, labeling the machine-readable medium 638 "non-transitory" should not be construed to mean that the machine-readable medium 638 is incapable of movement; the machine-readable medium 638 should be considered as being transportable from one physical location to another. Additionally, since the machine-readable medium 638 is tangible, the machine-readable medium 638 may be considered to be a machine-readable device.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to some embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, components, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A system comprising:
   a memory storing instructions; and
   a hardware processor communicatively coupled to the memory and configured by the instructions to perform operations comprising:
   for a select memory library cell instance of a set of memory library cell instances of a circuit design:
   generating a select wrapper instance of a given wrapper from a set of wrappers for a set of memory library cells, the set of memory library cells implementing the set of memory library cell instances, the given wrapper encapsulating a given memory library cell represented by the select memory library cell instance; and
   determining a set of power consumption values for the select memory library cell instance based on the select wrapper instance, a set of toggle values of the given wrapper, and a set of probability values of the given wrapper;
   based on one or more sets of power consumption values for one or more memory library cell instances of the set of memory library cell instances, determining an estimated power consumption by the one or more memory library cell instances during performance of a set of test algorithms by memory built-in self-test (MBIST) logic of the circuit design according to at least one test-algorithm-performance schedule; and
   providing a user with the estimated power consumption.

2. The system of claim 1, wherein the generating of the select wrapper instance comprises:
   determining one or more actual values of the select memory library cell instance from the circuit design; and
   initializing one or more parameter values of the select wrapper instance based on the one or more actual values of the select memory library cell instance, the determining of the set of power consumption values based on the select wrapper instance comprising determining the set of power consumption values based on the one or more parameter values.

3. The system of claim 2, wherein the one or more parameter values comprise values for one or more power parameters, and wherein the one or more parameter values comprise at least one of a value for a slew parameter or a value for a capacitance parameter.

4. The system of claim 1, wherein the operations comprise:
   generating the set of wrappers for the set of memory library cells.

5. The system of claim 4, wherein the generating of the set of wrappers for the set of memory library cells comprises:
   generating, for an individual memory library cell of the set of memory library cells, the individual wrapper that encapsulates the individual memory library cell.

6. The system of claim 1, wherein the operations comprise:
   determining the set of toggle values for the select wrapper by determining the set of toggle values for a set of pins of the select memory library cell encapsulated by the select wrapper, the determining of the set of toggle values for the set of pins comprising at least one of:
   determining a toggle value of zero for a pin of the set of pins that receives a constant signal value;

determining a toggle value of zero for a pin of the set of pins that is unused by any test performed by the MBIST logic;

determining a toggle value based on a clock frequency for a pin of the set of pins that is used by the at least one test performed by the MBIST logic; or determining a toggle value based on the clock frequency for a pin of the set of pins that receives a clock signal.

7. The system of claim 1, wherein the operations comprise:

determining the set of probability values for the select wrapper by determining the set of probability values for a set of pins of the select memory library cell encapsulated by the select wrapper instance, the determining of the set of probability values for the set of pins comprising at least one of:

determining a probability value of 0.5 for a pin of the set of pins that receives a clock signal;

determining a probability value of zero for a pin of the set of pins that receives a constant signal value of zero;

determining a probability value of disable state for a pin of the set of pins that is unused by any test performed by the MBIST logic;

determining a probability value of enabled state for a pin of the set of pins that is used by the at least one test performed by the MBIST logic; or determining a probability value of 0.5 for a pin of the set of pins that receives memory address data.

8. The system of claim 1, wherein the determining of the set of power consumption values for the select memory library cell instance based on the select wrapper instance, the set of toggle values, and the set of probability values comprises:

applying a power estimation method to the select wrapper instance based on the set of toggle values and the set of probability values.

9. The system of claim 8, wherein the power estimation method comprises a Joules-based method.

10. The system of claim 1, wherein the set of power consumption values for the select memory library cell instance comprises one or more power consumption values for one or more pins of the select memory library cell instance.

11. The system of claim 1, wherein the set of power consumption values for the select memory library cell instance comprises one or more power consumption values for one or more ports of the select memory library cell instance, each port comprising two or more pins of the select memory library cell instance.

12. The system of claim 1, wherein the set of power consumption values for the select memory library cell instance comprises one or more peak power consumption values.

13. The system of claim 1, wherein the providing of the user with the estimated power consumption comprises:

causing the estimated power consumption to be displayed to the user by a hardware display operatively coupled to the system.

14. The system of claim 1, wherein the operations comprise:

selecting, from a plurality of test-algorithm-performance schedules for performing the set of test algorithms, the at least one test-algorithm-performance schedule based on the estimated power consumption determined for the at least one test-algorithm-performance schedule.

15. The system of claim 14, wherein the operations comprise:

causing the set of test algorithms to be performed on a physical circuit according to the at least one test-algorithm-performance schedule, the physical circuit being manufactured based on the circuit design.

16. The system of claim 1, wherein the estimated power consumption comprises an estimated peak power consumption value.

17. The system of claim 1, wherein the operations comprise:

accessing circuit data describing the circuit design, the circuit design comprising the set of memory library cell instances and the MBIST logic.

18. A non-transitory computer-readable medium comprising instructions that, when executed by a hardware processor of a device, cause the device to perform operations comprising:

determining a set of memory library cells used to implement a set of memory library cell instances of a circuit design;

generating a set of wrappers for the set of memory library cells;

determining, for an individual wrapper of the set of wrappers, both a set of toggle values and a set of probability values for a set of pins of an individual memory library cell of the set of memory library cells, the individual memory library cell being encapsulated by the individual wrapper;

for a select memory library cell instance of the set of memory library cell instances:

generating a select wrapper instance of a given wrapper from the set of wrappers, the given wrapper corresponding to a given memory library cell represented by the select memory library cell instance; and determining a set of power consumption values for the select memory library cell instance based on the select wrapper instance, the set of toggle values of the given wrapper, and the set of probability values of the given wrapper;

based on one or more sets of power consumption values for one or more memory library cell instances of the set of memory library cell instances, determining an estimated power consumption by the one or more memory library cell instances during performance of a set of test algorithms by memory built-in self-test (MBIST) logic of the circuit design according to at least one test-algorithm-performance schedule; and providing a user with the estimated power consumption.

19. The non-transitory computer-readable medium of claim 18, wherein during the generating of the set of wrappers for the set of memory library cells, two or more wrappers of the set of wrappers are generated in parallel.

20. A method comprising:

determining, by a hardware processor, a set of memory library cells used to implement a set of memory library cell instances of a circuit design;

generating, by the hardware processor, a set of wrappers for the set of memory library cells;

determining, by the hardware processor and for an individual wrapper of the set of wrappers, both a set of toggle values and a set of probability values for a set of pins of an individual memory library cell of the set of memory library cells, the individual memory library cell being encapsulated by the individual wrapper;

for a select memory library cell instance of the set of memory library cell instances:

generating, by the hardware processor, a select wrapper instance of a given wrapper from the set of wrappers, the given wrapper corresponding to a given memory library cell represented by the select memory library cell instance; and determining, by the hardware processor, a set of power consumption values for the select memory library cell instance based on the select wrapper instance, the set of toggle values of the given wrapper, and the set of probability values of the given wrapper;

based on one or more sets of power consumption values for one or more memory library cell instances of the set of memory library cell instances, determining, by the hardware processor, an estimated power consumption by the one or more memory library cell instances during performance of a set of test algorithms by memory built-in self-test (MBIST) logic of the circuit design according to at least one test-algorithm-performance schedule; and providing, by the hardware processor, a user with the estimated power consumption.

\* \* \* \* \*